United States Patent [19]

Chau et al.

[11] Patent Number: 5,434,093
[45] Date of Patent: Jul. 18, 1995

[54] INVERTED SPACER TRANSISTOR

[75] Inventors: Robert S. Chau, Beaverton; Chan-Hong Chern, Portland; Shahriar S. Ahmed, Beaverton; Robert F. Hainsey, Portland; Robert J. Stoner, Aloha; Todd E. Wilke; Leopoldo D. Yau, both of Portland, all of Oreg.

[73] Assignee: Intel Corporation, Santa Clara, Calif.

[21] Appl. No.: 288,332

[22] Filed: Aug. 10, 1994

[51] Int. Cl.$^6$ .................................. H01L 21/265
[52] U.S. Cl. .................................. 437/41; 437/40; 437/44; 437/45; 437/984
[58] Field of Search .............. 437/40, 41, 44, 45, 437/984

[56] References Cited

U.S. PATENT DOCUMENTS

| | | | |
|---|---|---|---|
| 4,378,627 | 4/1983 | Jambotkar | 437/41 |
| 4,895,520 | 1/1990 | Berg | 437/45 |
| 5,034,351 | 7/1991 | Sun et al. | 437/41 |
| 5,047,361 | 9/1991 | Matloubian et al. | 437/40 |
| 5,082,794 | 1/1992 | Pfiester et al. | 437/41 |
| 5,091,763 | 2/1992 | Sanchez | 437/41 |
| 5,175,119 | 12/1992 | Matsutani | 437/41 |
| 5,217,910 | 6/1993 | Shimizu et al. | 437/44 |
| 5,223,445 | 6/1993 | Fuse | 437/44 |

OTHER PUBLICATIONS

"A Fully Planarized C.25 μm CMOS Technology", D. S. Wen, W. H. Chang, Y. Lii, A. C. Megdanis, P. McFarland and G. B. Bonner, VLSI, 1992.

"A Sub-0.1-μm Groved Gate MOSFET with High Immunity to Short-Channel Effects", Junko Tanka, Shin'ichiro Kimura, Hiromasa Noda, Toru Toyabe and Sigeo Ihara, IEEE, 1993.

"A 0.1 μm-gate Elevated Source and Drain MOSFET fabricated by Phase-shifted Lithography", Shin'ichiro Kimura, Hiromasa Noda, Digh Hisamoto and Eiji Takeda, IEDM, 1991.

Primary Examiner—Brian E. Hearn
Assistant Examiner—Trung Dang
Attorney, Agent, or Firm—Blakely, Sokoloff, Taylor & Zafman

[57] ABSTRACT

A method for forming narrow length transistors by forming a trench in a first layer over a semiconductor substrate. Spacers are then formed within the trench and a gate dielectric is formed between the spacers at the bottom of the trench on the semiconductor substrate. The trench is then filled with a gate electrode material which is chemically-mechanically polished back to isolate the gate electrode material within the trench, and the first layer is removed leaving the gate dielectric, gate electrode and spacers behind.

25 Claims, 11 Drawing Sheets

5,434,093

INVERTED SPACER TRANSISTOR

FIELD OF THE INVENTION

The present invention relates to semiconductor processing and more particularly to a method of forming a transistor on a semiconductor substrate.

BACKGROUND OF THE INVENTION

As the demand for cheaper, faster, lower power consuming microprocessors increases, so must the device packing density of the integrated circuit (IC). Minimizing transistor dimensions is of paramount importance to the advancement of semiconductor technologies in two respects. First, minimizing transistor dimensions inherently increases the switching speed of the transistor because, for instance, charge carriers such as electrons have a shorter distance to travel between the transistor's source and drain. Because the charge carriers travel a shorter distance they are able to complete the journey in a shorter period of time. Second, minimizing transistor dimensions allows more transistors to be formed in a given area, since the transistors may be spaced closer together. The ability to place more transistors in an IC contained on a semiconductor chip allows more complex and sophisticated functionality to be incorporated into the chip. Therefore, as a result of reducing the size of transistors in an IC, products which use such ICs, such as, for example, home computers, will be able to operate faster and with greater functionality than ever before.

Minimizing transistor dimensions is typically done by minimizing the critical dimension (CD) printable by a given photolithographic technology. The CD for a given photolithographic technology is generally considered the minimum width which that technology can resolve. For example, FIGS. 1a–1f exemplify a typical process sequence used to fabricate a transistor whose dimensions are ultimately dependent on the photolithographic technology employed.

FIG. 1a illustrates a first photolithographic step determining what will ultimately become the minimum size of a transistor being fabricated in a typical semiconductor process. Onto silicon substrate 100 has been grown a silicon dioxide layer 101 (oxide). Polysilicon layer 102 has been deposited onto the oxide layer 101. Polysilicon layer 102 will ultimately become the gate electrode for the resulting transistor while oxide layer 101 will become the gate oxide for the final transistor. Over polysilicon layer 102 has been spun a photoresist layer 103. Photoresist is a material whose chemical composition is sensitive to certain wavelengths of light. Photoresist layer 103 in FIG. 1a is a positive resist. In a positive resist, photochemical changes take place in the photoresist molecules upon exposure to appropriate wavelengths of light. Such photochemical changes results in the exposed regions of the photoresist layer becoming soluble in a particular solvent known as a developer. Therefore, regions of photoresist layer 103 which are exposed to the appropriate light and subsequently immersed in a developer will be dissolved away while regions of photoresist layer 103 which were not exposed to the light will remain insoluble to the developer and remain on the underlying polysilicon layer 102.

105 in FIG. 1a represents a photolithographic mask or reticle. Such a mask contains opaque features 104 affixed to a transparent substrate 113. When mask 105 is placed between an appropriate light source and photoresist layer 103, the opaque region 104 will block the incident light from reaching the respective region of photoresist layer 103. Regions of mask 105 which do not contain opaque features allow incident light to pass through transparent substrate 113 and expose the respective regions of photoresist layer 103. The width 106 of opaque region 104 translates to the critical dimension (CD) 107 of FIG. 1b.

This width 106 will ultimately determine the transistor length of the final transistor. If width 106 is too large, the final transistor will operate slowly and fewer transistors will be able to fit in a given area. However, if width 106 is too narrow, its image may not be accurately resolved onto photoresist layer 103. Resolution of an opaque feature of a photolithographic mask onto a photoresist layer is heavily dependent upon the wavelength of the incident light to which the photoresist is sensitive. Virtually all commercially available photolithographic systems utilize mercury vapor lamps as their illumination source. The most advanced of such photolithographic systems primarily utilize the mercury vapor spectrum having a wavelength range between 390–450 nm. Such systems are known as i-line steppers and are capable of resolving CDs as narrow as 0.4 microns. It should be noted that other technologies are employed in conjunction with the simplistic representation of the photolithographic process depicted in FIG. 1a. For example, in an image reduction system, mirrors and lenses may be utilized to focus a reduced image of the opaque features of a mask onto the surface of a photoresist layer, thereby optically shrinking the image on the mask. In addition, advanced mask technologies such as phase shift masking (PSM) are utilized to better enhance and resolve the masked images onto the photoresist layer. However, it is still a limitation of current transistor fabrication technologies that the CDs of masks ultimately determine the size of the transistors which those masks are used to create.

FIG. 1b shows the silicon substrate 100 of FIG. 1a after photoresist layer 103 has been exposed by the mask 105 and subsequently immersed in a developing solution. The CD 107 of the remaining photoresist feature 103 in FIG. 1b will be approximately proportional to width 106 of mask 105 in FIG. 1a. Using currently available i-line photolithographic systems, CD 107 will be a minimum of 0.4 microns. Photoresist feature 103 of FIG. 1b will now serve to protect the underlying layers from the etch chemistry of a subsequent anisotropic etch.

FIG. 1c shows the silicon substrate 100 depicted in FIG. 1b after an anisotropic polysilicon and oxide etch has been performed. Because the etch is anisotropic, the edges of polysilicon layer 102 and oxide layer 101 will be substantially flush with the edges of photoresist 103. Therefore, the width of the post-etch polysilicon layer under the photoresist 103 will be the same as CD 107 of the photoresist feature 103.

FIG. 1d displays silicon substrate 100 depicted in FIG. 1c after the remainder of photoresist layer 103 has been removed and a tip implant has been performed. As can be seen, the width of polysilicon gate electrode 102 is the same CD 107 that was developed into photoresist layer 103 in FIG. 1b. A dopant material is implanted into the silicon substrate 100 from a direction perpendicular to the substrate. The region in silicon substrate 100 which lies beneath polysilicon gate electrode 102 will be protected from this dopant implant step by polysilicon gate electrode 102. As a result, dopant regions 108a and 108b are formed in silicon substrate 100. Because the polysilicon gate electrode 102 acts as a masking layer to effectively block the dopant implant from forming doped regions within silicon substrate 100 lying beneath polysilicon gate electrode 102, such a technique forms what is known as a self-aligned gate. The structure is said to be self-aligned because the use of the gate electrode as a masking layer effectively aligns the implant regions to its edges.

FIG. 1e shows the substrate of FIG. 1d after an oxide layer 109 has been conformally deposited over the surface of the substrate. As can be seen in FIG. 1e, oxide layer 109 is deposited relatively uniformly along the surface of silicon substrate 100 as well as the surface and sidewalls of polysilicon gate electrode 102. Due to the topographical nature of the substrate in FIG. 1e and the conformally deposited characteristics of oxide layer 109, the thickness of oxide layer 109 (as measured in a direction perpendicular to the surface of the underlying substrate) is greatest in the regions adjacent to the edges of polysilicon gate electrode 102. In other words, oxide layer 109 is thickest where oxide layer 109 is in transition between the surface of silicon substrate 100 and the surface of polysilicon gate electrode 102. This thickness variation in oxide layer 109 may be exploited to create a feature known as a spacer.

FIG. 1f displays the silicon substrate region 100 depicted in FIG. 1e after an anisotropic etch has created spacers from oxide layer 109 and a source/drain implant has been performed. By performing an anisotropic etch of oxide layer 109, the spacers 110a and 110b adjacent to the sides of polysilicon gate electrode 102 are created. Spacers 110a and 110b serve two important functions. First, because these spacers reside along and conform to the edges of polysilicon gate electrode 102 and gate oxide 101, spacers 110a and 110b serve to protect these regions of the transistor from subsequent damage or contamination. Second, spacers 110a and 110b serve to mask the underlying silicon substrate 100 from the subsequent source/drain implant step which creates doped regions 111a and 111b. As described above in conjunction with the tip implant forming tip regions 108a and 108b, polysilicon gate electrode 102 masks the underlying silicon substrate 100 from the source/drain implant which forms regions 111a and 111b. Because spacers 110a and 110b reside above tip regions 108a and 108b, these regions do not receive the higher dose source/drain implant which forms regions 111a and 111b. The regions 108a and 108b are more lightly doped than the regions 111a and 111b in order to improve certain performance characteristics of the transistor such as junction break-down and hot electron injection. The distance 112 between lightly doped tip region 108a on one side of the transistor and lightly doped tip region 108b on the other side of the transistor represents the transistor's approximate length. This is the distance which a charge carrier, such as an electron, must travel in order to induce the current associated with the transistor's "on" state. It is this transistor length 112 which must be reduced in order to improve a transistor's speed, as discussed above.

Note that transistor length 112 is approximately equal to polysilicon gate electrode width 107. This is because it was the polysilicon gate electrode width 107 which initially defined the region into which the tip dopants were implanted in silicon substrate 100. Further note that polysilicon gate electrode width 107 was formed by anisotropically etching around photoresist CD 107. Ultimately, photoresist CD 107 was determined by photolithographic printing of image 104 from mask 105. Therefore, it can be seen that the final transistor length 112, which plays a significant role in determining a transistor's speed and size, is inherently dependent upon the minimum CD which a given photolithographic process is capable of resolving. Because of this perennial link between photolithographic technology and transistor size, much effort and expense has been directed to the continual improvement of photolithographic technologies. However, it is believed that mercury vapor lamps used to generate UV radiation in conventional photolithographic technologies have become the key limiting factor to continued compaction of IC devices.

More advanced and complex photolithographic technologies have been developed to create the next generation of IC devices. Three such technologies include electron beam lithography, x-ray lithography and ion beam lithography. Electron beam lithography involves drawing a circuit pattern directly onto an electron beam sensitive resist material using a narrow stream of electrons. Using electron beam lithography, features as small as 0.1 microns may be printed. However, electron beam systems have been plagued with resolution problems resulting from electron scattering and electron beam resist processing. In addition, electron beam lithographic processes have extremely slow throughput times thereby making such processes nearly unmanufacturable. Also, electron beam lithography systems cost several times what currently available i-line photolithographic systems cost. Ion beam lithography has developed as an alternative to electron beam lithography since ions are less prone to scattering than are electrons. However, no commercially available manufacturable systems have been created.

The theory behind x-ray lithography is that x-rays, having a much smaller wavelength than UV light, can be used to replace UV sources in conventional lithographic processes to create much smaller feature sizes with better resolution. Unfortunately, x-rays are extremely difficult to control because they cannot be bent or focused in the same manner that conventional UV rays may be manipulated. In addition, there are currently no commercially available x-ray systems suitable for production use, nor is there any currently available production process capable of fabricating an effective mask which can selectively block x-rays.

Thus, scientists and engineers continue to expend vast resources in order to advance photolithographic technologies to support continued shrinking of transistor gate lengths in MOS processes. However, what would be most desireable is a manufacturable process whereby transistor gate lengths can be minimized regardless of the photolithographic technology employed.

SUMMARY OF THE PRESENT INVENTION

A method for forming very narrow p-channel metal-oxide-semiconductor (PMOS) and n-channel metal-oxide-semiconductor (NMOS) transistors is described. In one embodiment, a thick dielectric layer is first formed over a semiconductor substrate. A trench defined using photolithographic techniques is then etched through the dielectric layer to the underlying semiconductor substrate. A second dielectric layer is then conformally deposited over the surface of the substrate substantially coating the walls and floor of the trench. This second dielectric layer is subsequently anisotropically etched back to form spacers against the sidewalls within the trench. A gate oxide is formed on the exposed semiconductor substrate between the spacers within the trench. A polysilicon layer is thereafter deposited to a thickness which will substantially fill the remainder of the trench between the spacers. The polysilicon layer is then etched back using a chemical-mechanical polishing process in order to remove the polysilicon material from the region above the first dielectric layer surrounding the trench. Thus, the polysilicon material will be substantially isolated within the trench.

The remainder of the first dielectric material is thereafter removed using a self-aligned dry etch technique, whereupon tip and source/drain implants may be subsequently performed. The tip may be formed by any one of a number of methods, including a tipless flow process, angled implant, diffusion from doped spacers, a raised tip process, counterdoping, or a disposable spacer flow. The source/drain region may be formed by performing a conventional implant process using the inverted spacers and polysilicon as a mask, or by creating a raised source/drain by epitaxial growth to form a self-aligned gate transistor.

Finally, a salicidation process is performed in order to convert the exposed silicon regions, that is the source/drain surface and polysilicon surface, into a silicide.

DETAILED DESCRIPTION

A manufacturable method for forming very narrow NMOS and PMOS transistors is described. In the following description, numerous specific details such as layer thicknesses, process sequences, material compositions, etc. are set forth in order to provide a more thorough understanding of the present invention. However, it will be obvious to one skilled in the art that the present invention may be practiced without employing these specific details. In other instances, well-known processes and processing techniques and equipment have not been described in detail in order to avoid unnecessarily obscuring the present invention.

While diagrams representing various embodiments of the present invention are illustrated in FIGS. 2a–6c, these illustrations are not intended to limit the invention. The specific processes described herein are only meant to clarify an understanding of the present invention and to illustrate embodiments of how the present invention may be implemented in order to form a certain types of devices. For the purposes of this discussion, a semiconductor substrate is a substrate comprising any material or materials used in the manufacture of a semiconductor device. A substrate is a structure on which or to which a processing step acts upon.

The present invention is described herein in conjunction with planarized isolation technology for isolation of transistors. However, it may also be employed in conjunction with other, non-planarized isolation technologies such as recessed LOCOS (Local Oxidation of Silicon) or standard LOCOS.

Figure 2A:
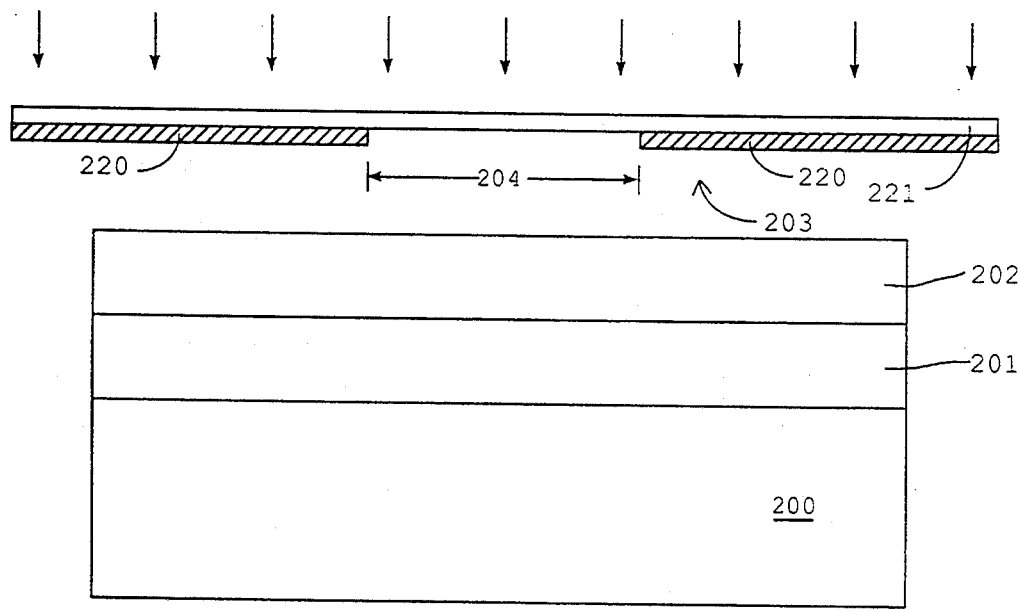
FIG. 2a is an illustration of a cross-sectional view of a semiconductor substrate undergoing a photolithographic process.

In accordance with the present invention, a photoresist layer 202 is first spun onto dielectric layer 201, which is deposited onto semiconductor substrate 200 as shown in FIG. 2a. Layer 201 is deposited by chemical vapor deposition "CVD" of silicon nitride ("nitride") to a thickness in the range of approximately 0.2 to 0.4 microns. The thickness of layer 201 ultimately determines the approximate thickness of the subsequently formed polysilicon gate electrode for the transistor. Therefore, in determining the thickness for layer 201, one must consider that a polysilicon gate electrode which is too thin may not adequately mask the underlying semiconductor substrate from a self aligned implant process and may not provide enough silicon material to accommodate a silicidation process. However, a thicker polysilicon gate electrode is more difficult to dope, may suffer from polysilicon depletion effects, and can cause significant topographical complications. Also note that the thickness of a gate electrode has a significant impact on that electrode's resistivity. For example, if a polysilicon gate electrode is to be used as a resistor, or a device interconnect in an IC, the thickness of the polysilicon gate electrode, and hence, the thickness of layer 201, must be taken into consideration. With this in mind, the thickness of layer 201 is selected, for the embodiment of FIGS. 2a–2i, within the range of approximately 0.05 to 1.0 microns. Certainly, if alternate gate electrode technologies are employed in conjunction with the present invention, alternate layer 201 thickness ranges may be necessary.

As stated above, layer 201 comprises nitride. In one embodiment of the present invention, nitride is chosen for layer 201 due to its slow etch rate as compared to polysilicon during a subsequent chemical mechanical polish of the polysilicon layer described below. In addition, a thin layer of silicon dioxide (oxide) preferably separates the nitride in layer 201 from the silicon in substrate 200. This pad oxide may have a thickness in the range of approximately 50Å–100Å. The pad oxide serves to protect the silicon lattice from damage. Alternatively, layer 201 may be replaced by or incorporate an oxide, a borosilicate glass "BSG", a phosphosilicate glass "PSG", or any other material having properties of a dielectric. In general, layer 201 comprises a material which can act as an etch stop to a subsequent chemical mechanical polish step described below.

Mask 203 is depicted in FIG. 2a in order to demonstrate the relative independence between the photolithographic technology used to create a transistor in accordance with the present invention and the transistor's ultimate length. As can be seen on mask 203, an opening in opaque region 220 having a width 204 is used to expose a photoresist layer 202. Incident radiation is blocked by the opaque features 220 on mask 203 and passes through transparent material 221 in the region 204 to expose photoresist layer 202. Of course, mirrors and lenses may be used to adjust the projected size of region 204 onto photoresist layer 202. Note that while a more conventional photolithographic technique is illustrated in FIG. 2a, the present invention may be practiced in conjunction with other more advanced photolithographic technologies as they become available.

Figure 2B:
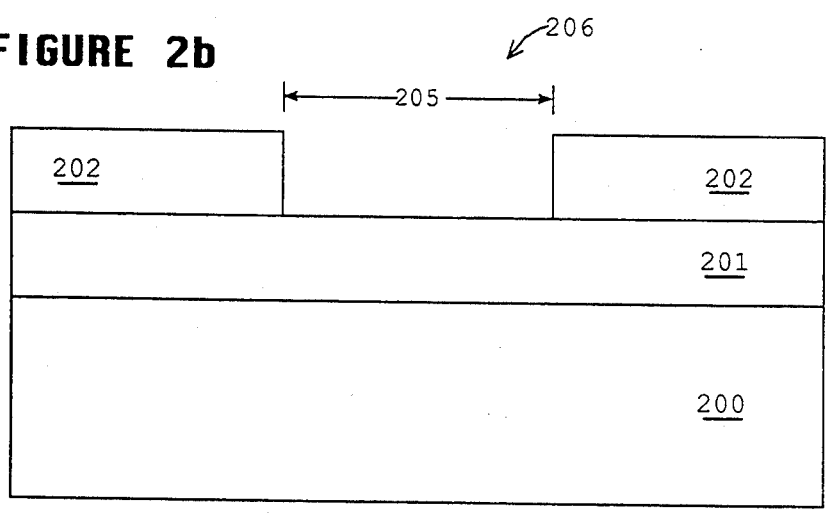
FIG. 2b is an illustration of a cross-sectional view of the semiconductor substrate of FIG. 2a after the photoresist has been developed.

FIG. 2b illustrates the substrate region shown in FIG. 2a after photoresist layer 202 has been exposed by mask 203 and developed in order to reveal the underlying layer 201 within the region 206 having a CD 205. In one embodiment, CD 205 represents the minimum feature width capable of being resolved by the photolithographic technology employed in conjunction with the present invention. As stated above, the final transistor length is independent of the photolithographic technology used, however minimum transistor length control is improved by forming the minimum resolvable CD 205 within photoresist layer 202. For present, commercially available, manufacturable photolithographic systems, this minimum CD 205 is in the range of approximately 0.3 to 0.5 microns. Such a CD may be obtained using conventional i-line photolithographic techniques. Alternatively, more inexpensive photolithographic systems may be employed to create CD's wider than 0.5 microns. However, in such embodiments some control over the final transistor length may be lost. It is to be appreciated that as photolithographic technologies improve, so may CD 205 be minimized. Alternative systems and techniques may be employed to create a CD 205 within the range of approximately 0.1 to 1.0 microns, and even within the sub-0.1 micron regime.

Figure 2C:
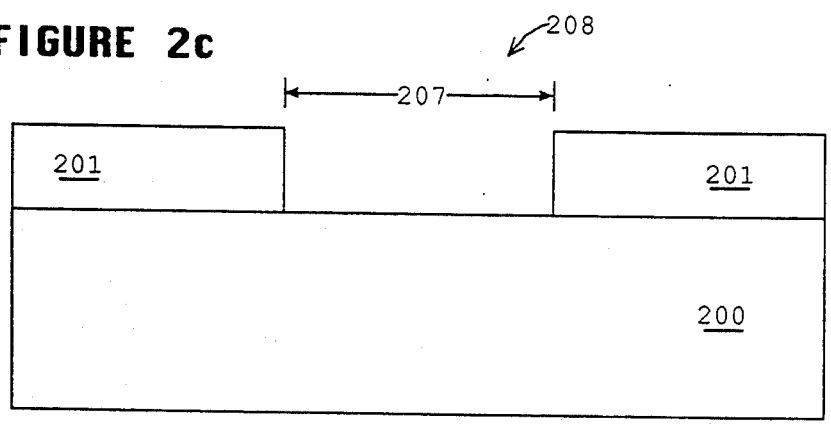
FIG. 2c is an illustration of a cross-sectional view of the semiconductor substrate of FIG. 2b after a trench has been etched and the photoresist has been removed.

FIG. 2c depicts the region of silicon substrate 200 shown in FIG. 2b after layer 201 has been anisotropically etched to form trench 208 using photoresist layer 202 as a mask, and photoresist layer 202 has been subsequently removed. Since layer 201 was masked by photoresist layer 202 during the anisotropic etch, the width 207 of trench 208 formed in nitride layer 201 should be approximately equal to CD 205 in photoresist layer 202 of FIG. 2b. It is within trench 208 that the transistor will ultimately be formed. Therefore, there are additional factors which must be considered in determining the appropriate width 207 of trench 208 and, consequently, the appropriate width 205 of region 206 of FIG. 2b. For example, trench 208 must be wide enough to accommodate the necessary spacer formation (described below). In addition, since the transistor will be formed in trench 208, by minimizing width 207 the area which the final transistor will occupy will be similarly minimized, thereby increasing the packing density of the overall IC. Also, depending on the spacer thickness utilized in conjunction with the present invention, the width 207 of trench 208 in layer 201 may have a significant impact on the final width and, consequently, the final resistance of the gate electrode. Therefore, if the gate electrode is to be employed as, for instance, a resistor or an interconnect, one may wish to consider the impact which the width 207 of trench 208 may have in such applications. Generally, in regions where the gate electrode is to be used as an interconnect, the trench width will be much wider in order to minimize the interconnect resistance.

Figure 2D:
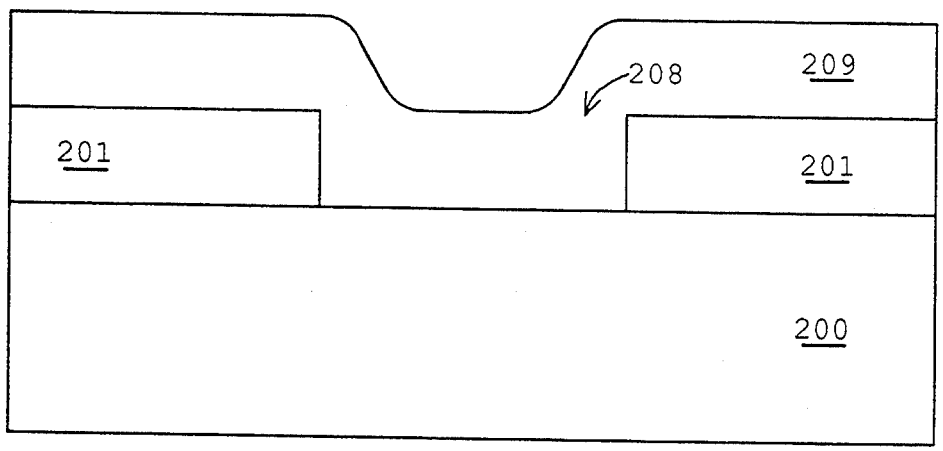
FIG. 2d is an illustration of a cross-sectional view of the semiconductor substrate of FIG. 2c after a spacer material has been deposited.

FIG. 2d illustrates the region of semiconductor substrate 200 shown in FIG. 2c after layer 209 has been deposited by CVD of oxide conformally over the surface of the substrate. In one embodiment of the present invention in which the width of trench 208 is in the range of approximately 0.3 to 0.5 microns, the thickness of layer 209 is in the range of approximately 0.1 to 0.25 microns. In alternate embodiments in which the width of trench 208 may range from as narrow as 0.1 microns in the case of advanced lithography processes, to as wide as approximately 1.0 microns in the case of older lithography technologies, the thickness of layer 209 may be in the range of approximately 0.05 to 0.5 microns. The thickness of layer 209 is heavily dependent upon the width of trench 208 and the desired transistor length of the transistor to be formed within trench 208. In general, each of the two spacers which will be formed from layer 209 will encroach into trench 208 by a distance approximately equal to the deposited thickness of layer 209. Therefore, knowing the desired transistor length and the width of trench 208, one can determine the approximate thickness for layer 209 by simply taking the width of trench 208, subtracting the desired transistor length, and dividing the result by two.

While layer 209 is an oxide layer in the embodiment of FIGS. 2a–2i, other materials suitable for constructing spacers may be used in place of or in conjunction with this oxide. Other such spacer materials include nitride, BSG, PSG, and other materials, preferably of a dielectric nature, suitable for use in a semiconductor manufacturing environment. An important feature to consider when selecting a spacer material is that the material must be capable of being deposited conformally over the surface of the substrate. In other words, the spacer material must be able to coat the walls of trench 208 to a thickness approximately equal to the thickness of the spacer material deposited on horizontal surfaces such as the surface of layer 201. Finally, in an embodiment in which the tip regions described below are formed by diffusion from doped spacers, layer 209 comprises a suitably doped material in proximity with semiconductor substrate 200 at the bottom of trench 208.

Figure 2E:
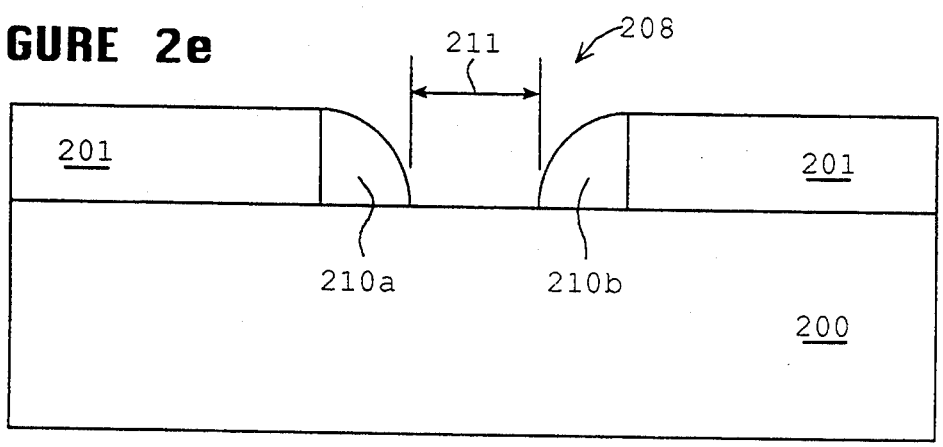
FIG. 2e is an illustration of a cross-sectional view of the semiconductor substrate of FIG. 2d after spacers have been formed.

FIG. 2e shows the region of semiconductor substrate 200 shown in FIG. 2d after layer 209 has been anisotropically etched back to form spacers 210a and 210b within trench 208. In an embodiment of the present invention in which the width of trench 208 is in the range of 0.3 to 0.5 microns, the width of each of spacers 210a and 210b are in the range of 0.1 to 0.25 microns. Alternatively, in an embodiment in which the width of trench 208 is in the range of approximately 0.1 to 1.0 microns, the width of each of spacers 210a and 210b are in the range of 0.05 to 0.5 microns. Note that the spacers 210a and 210b have been formed adjacent to the laterally opposing sidewalls within trench 208, leaving a gap of width 211 between them. This gap 211 will approximately be the final gate length of the transistor being fabricated. Therefore, it can be seen in FIG. 2e that the wider spacers 210a and 210b are, the narrower gap 211 will be, and, consequently, the narrower the transistor length will be. For example, in one embodiment in which a transistor length of 0.1 microns is desired, a trench 208 having a width of 0.4 microns and spacers 210a and 210b each having a width of 0.15 microns will result in the desired transistor length. In another embodiment of the present invention, the width of trench 208 and the width of spacers 210a and 210b are chosen such that the final gap length 211 is in the sub-0.1 micron regime. In general, the width of trench 208 and width of spacer 210a and 210b are appropriately chosen by the practitioner in order to generate the desired transistor length. At this point, in one embodiment of the present invention, a self-aligned punchthrough stopper may be formed by ion implantation of dopant material having the same conductive type as substrate 200. This ion implantation step is described below in conjunction with FIGS. 6a–c.

Figure 2F:
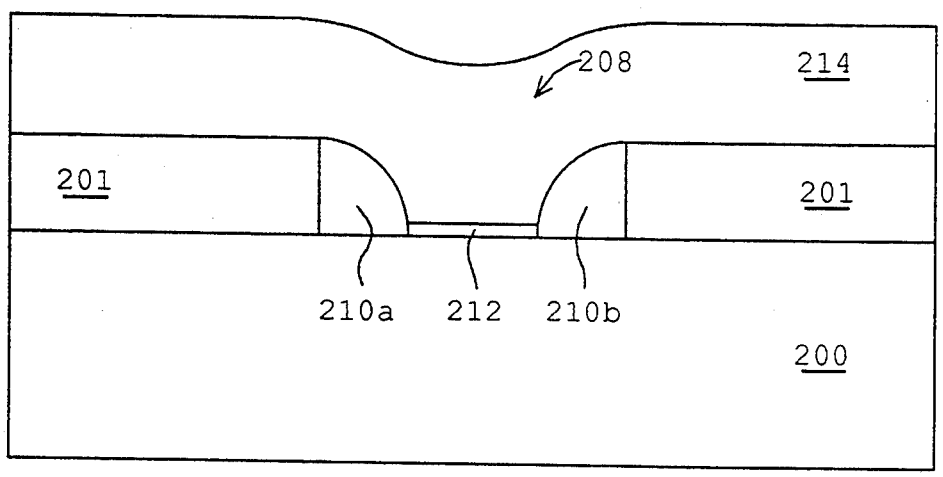
FIG. 2f is an illustration of a cross-sectional view of the semiconductor substrate of FIG. 2e after a layer has been deposited.

FIG. 2f displays the region of semiconductor substrate 200 shown in FIG. 2e after a gate oxide 212 has been formed and a polysilicon layer 214 has been deposited. Gate oxide 212 may be formed by thermal oxidation of the underlying silicon region. Alternatively, the thermal gate oxide 212 may be replaced by or formed in conjunction with a deposited oxide layer, nitride layer or any other material suitable for use as a gate dielectric. The thickness of gate oxide 212 is in the range of approximately 30 to 60 angstroms but may be chosen from the wider range of approximately 10 to 100 angstroms depending on the practitioner's requirements. In determining the thickness and composition of gate oxide 212, one might consider the transistor's desired threshold voltage, breakdown voltage requirements, hot electron susceptibility and overall robustness of the gate dielectric. In alternate embodiments of the present invention, all or a portion of gate oxide 212 may be formed earlier in the process sequence. For example, gate oxide 212 may be formed after etching trench 208 and before depositing layer 209. Alternatively, all or a portion of gate oxide 212 may be formed beneath layer 201 before etching trench 208. Note that one may desire to grow and etch a sacrificial oxide within trench 208 before forming gate oxide 212 in order to clean the silicon surface.

Polysilicon layer 214 is deposited thick enough to entirely fill the remainder of trench 208 with enough additional thickness to allow proper control and planarization during the subsequent chemical mechanical polish step. Alternatively, polysilicon layer 214 may be replaced by or incorporate alternate materials suitable for use in conjunction with a gate electrode such as, for example, refractory metals, silicides, and other conductive materials. At this step in the process sequence, it may be desirable to dope polysilicon layer 214 or, in accordance with the embodiment of the present invention depicted in FIGS. 2a–2i, doping of polysilicon layer 214 is deferred to a later process step as described below.

Figure 2G:
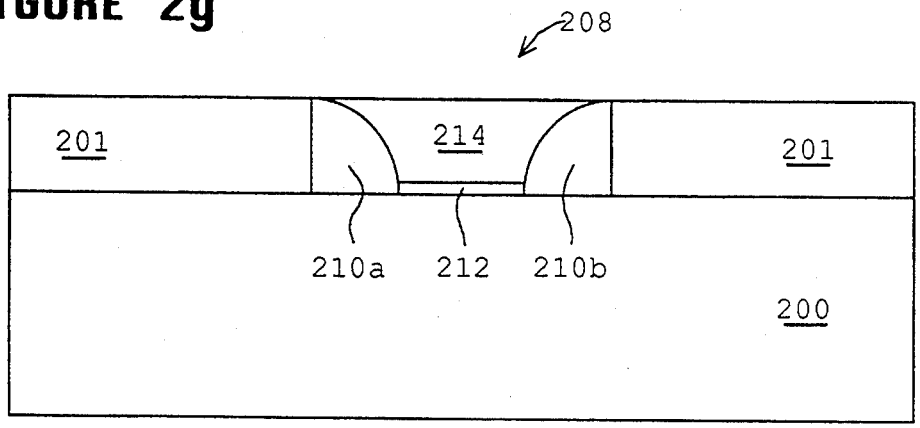
FIG. 2g is an illustration of a cross-sectional view of the semiconductor substrate of FIG. 2f after the layer has been etched back.

FIG. 2g illustrates the semiconductor region shown in FIG. 2f after polysilicon layer 214 has been etched back until polysilicon layer 214 is substantially planar with the surface of layer 201 using a chemical mechanical polish process. In one embodiment of the present invention, the chemical mechanical polish process used to etch back polysilicon layer 214 is executed using a chemistry which has a high selectivity of the polysilicon layer 214 over layer 201. In this manner, the polish process is able to stop at or near the surface of layer 201. This chemical mechanical process step serves to remove the polysilicon material 214 from the regions surrounding trench 208 such that the polysilicon material 214 becomes isolated within trench 208 between spacers 210a and 210b. This polysilicon material will serve as at least a portion of the gate electrode for the transistor. Alternatively, polysilicon layer 214 is etched back using reactive ion, plasma, or sputter etch techniques in order to isolate polysilicon layer 214 within trench 208. This unique process of self-aligning polysilicon layer 214 within trench 208 is novel in that no additional photolithographic step is required to define the polysilicon width. Such a technique is referred to as a polysilicon damascene process.

Figure 2H:
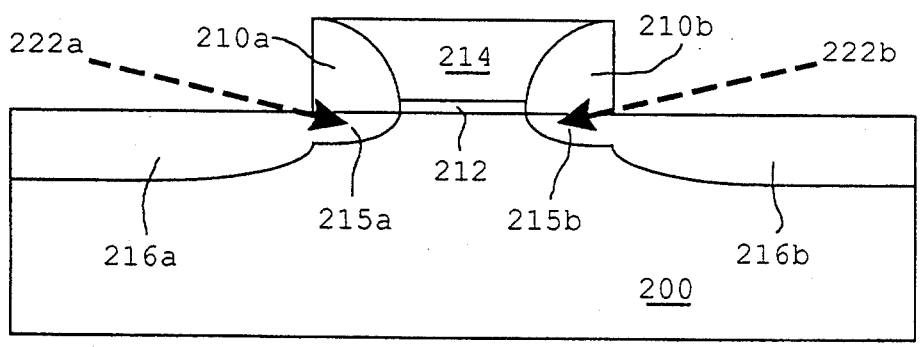
FIG. 2h is an illustration of a cross-sectional view of the semiconductor substrate of FIG. 2g after a layer has been removed and implants have been performed.

FIG. 2h displays the region of semiconductor substrate 200 shown in FIG. 2g after layer 201 has been removed and implants have been performed. In one embodiment of the present invention, layer 201 is anisotropically etched using a dry etch chemistry having an etch selectivity of layer 201 higher than the selectivity to polysilicon layer 214. In such an embodiment, the etch of layer 201 may be considered self-aligned to polysilicon layer 214 since no additional photolithographic step is required. Alternatively, layer 201 is etched by a wet chemistry having a suitably high etch selectivity of layer 201 over semiconductor substrate 200, spacers 201a and 210b, and polysilicon layer 214. Therefore, in such an embodiment it is desirable that layer 201 comprise materials different from the materials with which spacers 210a and 210b, and polysilicon layer 214 are formed. For example, in one embodiment, layer 201 comprises nitride while spacers 210a and 210b comprise oxide, and polysilicon layer 214 comprises polysilicon.

In one embodiment of the present invention, source/drain regions 216a and 216b are formed by an implant process which simultaneously dopes polysilicon layer 214. Polysilicon layer 214, along with spacers 210a and 210b, substantially mask the underlying semiconductor substrate 200 from the source/drain implant which forms source/drain regions 216a and 216b. For this reason, source/drain regions 216a and 216b are said to be self-aligned to the edges of spacers 210a and 210b as can be seen in FIG. 2h.

Figure 1A:
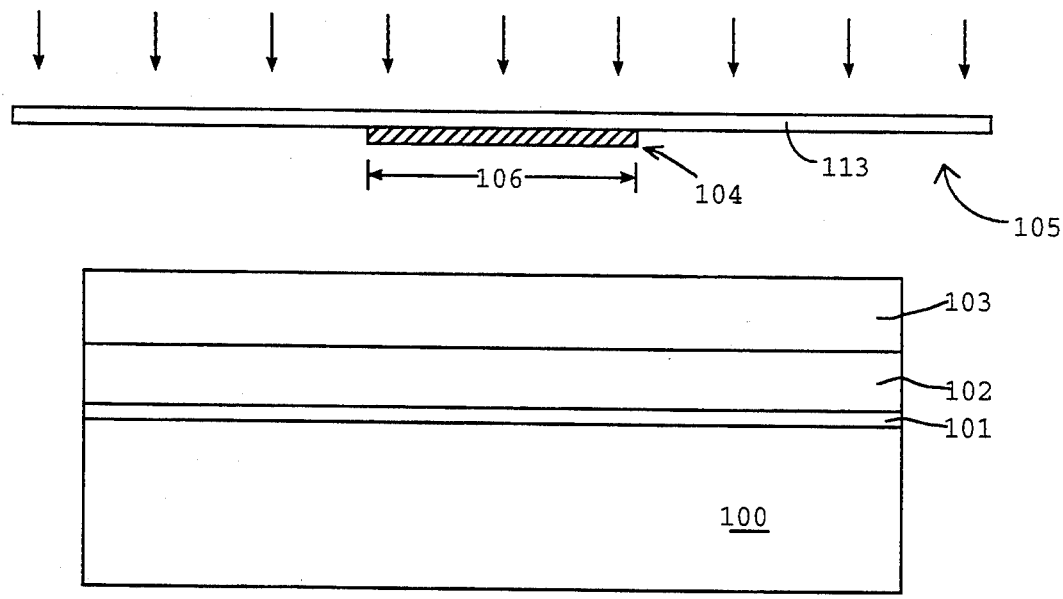
FIG. 1a is an illustration of a cross-sectional view of a semiconductor substrate undergoing a lithography process.
Figure 1B:
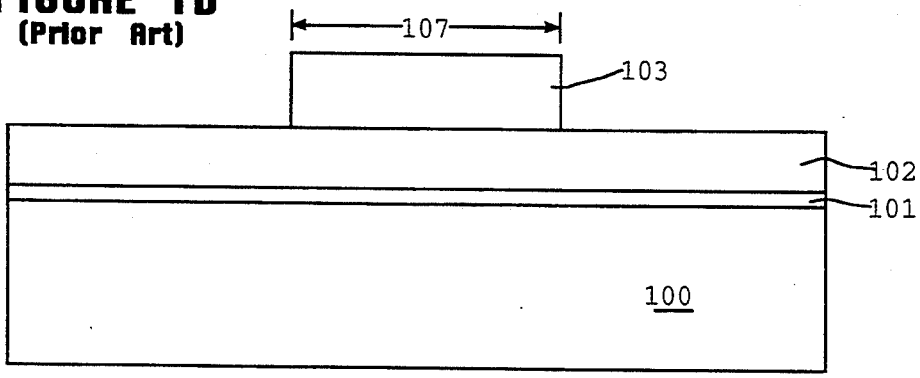
FIG. 1b is an illustration of a cross-sectional view of the semiconductor substrate of FIG. 1a after the photoresist has been developed.
Figure 1C:
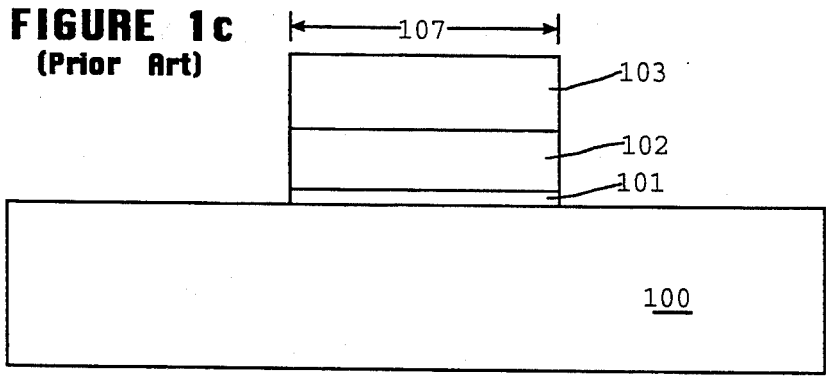
FIG. 1c is an illustration of a cross-sectional view of the semiconductor substrate of FIG. 1b after an anisotropic etch.
Figure 1D:
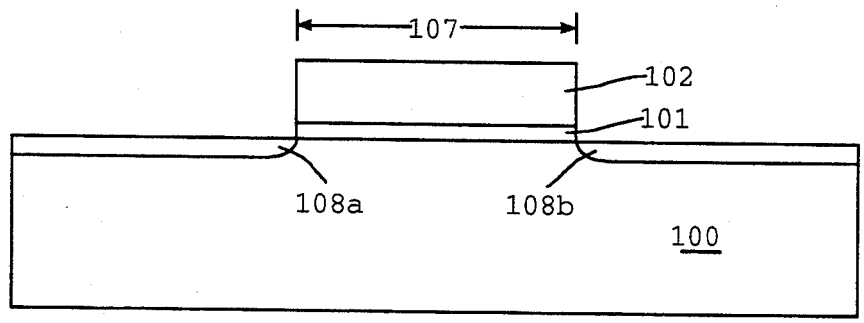
FIG. 1d is an illustration of a cross-sectional view of the semiconductor substrate of FIG. 1c after the photoresist has been removed and an implant has been performed.
Figure 1E:
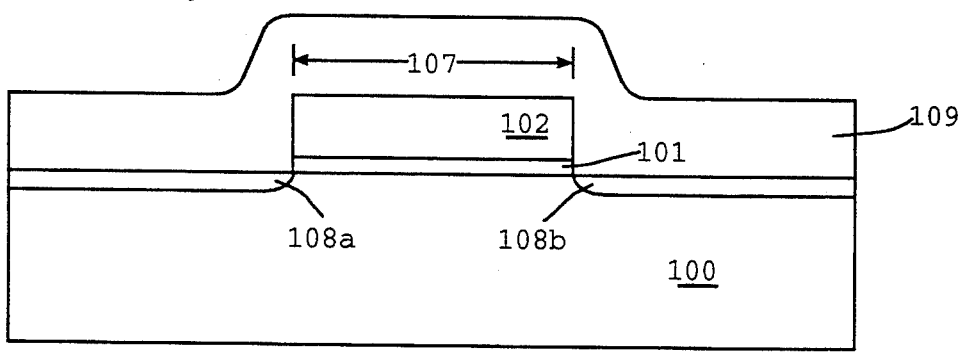
FIG. 1e is an illustration of a cross-sectional view of the semiconductor substrate of FIG. 1d after a spacer material has been deposited.
Figure 1F:
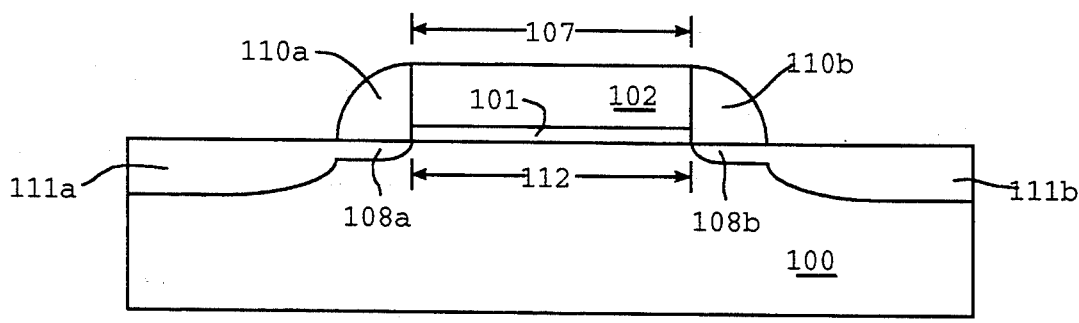
FIG. 1f is an illustration of a cross-sectional view of the semiconductor substrate of FIG. 1e after spacers have been formed and an implant has been performed.

Tip regions 215a and 215b are formed under at least a portion of spacers 210a and 210b by any one of a number of processes as described below. In an angled implant process, the implant angle of dopant materials used to create tip regions 215a and 215b are steep enough so as to drive the dopant material through semiconductor substrate 200 underneath spacers 210a and 210b as indicated by arrows 222a and 222b. Alternatively, tip regions 215a and 215b may be created using a tipless flow process. In a tipless flow process, high dose, low energy implants are used to dope semiconductor substrate 200 near the surface of source/drain regions 216a and 216b to a high concentration. Then, a subsequent thermal process (usually a rapid thermal anneal step, e.g. 1000° C. for 30 seconds) effectively spreads the dopant material laterally across the surface of semiconductor substrate 200 driving the dopant underneath spacers 210a and 210b to create tip regions 215a and 215b. In another embodiment of the present invention, tip regions 215a and 215b are formed by diffusion from doped spacers as described below in conjunction with FIGS. 5a–d. In this process, spacers 210a and 210b comprise a material containing a high concentration of dopant species. Upon thermal excitation, these dopants will diffuse out of spacers 210a and 210b and into semiconductor substrate 200 to form tip regions 215a and 215b. Tip regions 215a and 215b may be alternatively formed by a process known as a disposable spacer flow which involves removing spacers 210a and 210b in order to gain direct access to the surface of semiconductor substrate 200 in the regions 215a and 215b, thereby allowing these regions to be doped by, for example, ion implantation. After tip implant, spacers may then be reformed along the side walls of polysilicon gate electrode 214 and the transistor is completed by a process similar to the conventional process depicted in FIGS. 1e–f. Other tip and source/drain formation processes are described below in conjunction with other figures.

Figure 2I:
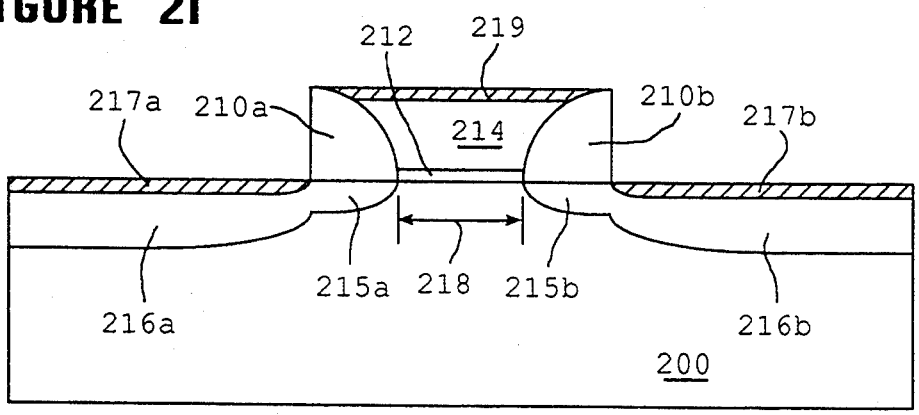
FIG. 2i is an illustration of a cross-sectional view of the semiconductor substrate of FIG. 2h after silicidation has been performed.

FIG. 2i shows the semiconductor substrate region 200 depicted in FIG. 2h after silicide regions 217a, 217b and 219 have been formed. These silicide regions are formed by coating the surface of the substrate depicted in FIG. 2h with a thin, refractory metal, such as tungsten or titanium, annealing the substrate to form the silicide, and removing the unreacted metal film by a selective etch. Such a silicidation process will form a metallic silicide from all exposed silicon regions, such as those at the surface of source/drain regions 216a and 216b as well as the exposed polysilicon at the surface of polysilicon layer 214. Such a process is known as a salicide technique (which stands for Self-ALIgned siliCIDE) because no additional photolithographic step is required. Alternatively, silicide regions 217a, 217b and 219 may be formed by other conventional silicidation techniques or may not be formed at all. To complete an IC from FIG. 2i, standard back-end processing steps are then executed including, for example, the formation of an interlayer dielectric over the substrate shown in FIG. 2i, and subsequent via and metalization formation steps.

While, for simplicity sake, the effects of diffusion of source/drain regions 216a and 216b and tip regions 215a and 215b within semiconductor substrate 200 have not been explicitly shown in FIGS. 2h and 2i, the distance 218 separating tip region 215a from 215b represents the approximate transistor length of the transistor shown. Note that transistor length 218 is directly related to the distance 211 between spacers 210a and 210b within trench 208 shown in FIG. 2e rather than the CD 205 of photoresist layer 202, shown in FIG. 2b. Therefore, the independence of transistor length 218 to the photolithographic technique used to manufacture the transistor of FIG. 2i from mask 203 can be seen. Rather, transistor length 218 depends mainly on the width of spacers of 210a and 210b, which is related to the thickness of layer 209, shown in FIG. 2d. Note that the gate electrode comprising polysilicon layer 214 and silicide (also known as polycide) layer 219 has been formed along what has conventionally been considered to be the back side of spacers 210a and 210b. Because spacers 210a and 210b have been inverted with respect to conventional transistor spacers 110a and 110b shown in FIG. 1f, and serve to reduce, rather than expand, the area which the transistor occupies, the transistor shown in FIG. 2i may be referred to as an inverted spacer transistor.

FIGS. 3a–6c illustrate other embodiments of the present invention to be used in conjunction with the basic process discussed above. In particular, FIGS. 3a–6c illustrate alternate tip and source/drain formation processes. For example, in a raised tip process the substrate of FIG. 3a may be substituted for the substrate shown in FIG. 2a where layer 302 is a photoresist layer, layer 301 comprises a material which can act as an etch stop to a subsequent chemical mechanical polish of the gate electrode material, and layer 303 is formed by a shallow implant into substrate 300. The conductivity type of substrate region 303 is opposite from the conductivity type of substrate 300 (meaning region 303 is n-type if substrate 300 is p-type, and vice-versa). Implant layer 303 will ultimately become the tip region of the transistor to be formed.

Figure 3A:
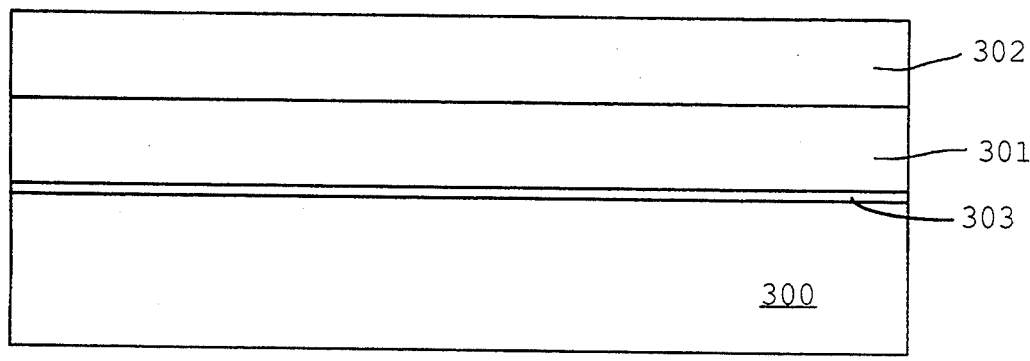
FIG. 3a is an illustration of a cross-sectional view of a semiconductor substrate.
Figure 3B:
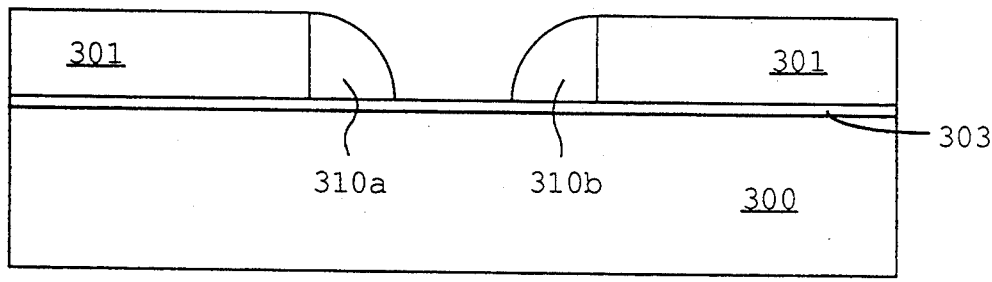
FIG. 3b is an illustration of a cross-sectional view of the semiconductor substrate of FIG. 3a after undergoing process steps in accordance with the present invention.

Standard processing as taught above in connection with FIGS. 2a–e is performed on the substrate of FIG. 3a resulting in the structure illustrated in FIG. 3b where 310a and 310b represent the spacers of this structure. Next, the underlying substrate between spacers 310a and 310b is etched through implant layer 303 into substrate 300 resulting in the structure illustrated in FIG. 3c. In one embodiment, substrate 300 is etched only slightly below the junction between implant layer 303 and substrate 300 between spacers 310a and 310b as shown.

Figure 3C:
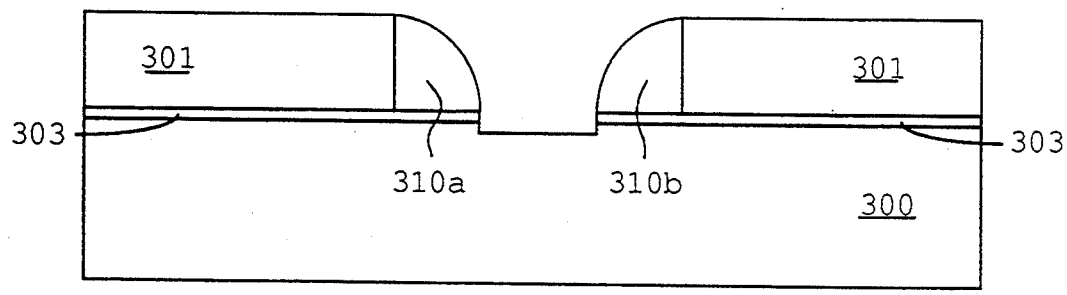
FIG. 3c is an illustration of a cross-sectional view of the semiconductor substrate of FIG. 3b after an etch step.
Figure 3D:
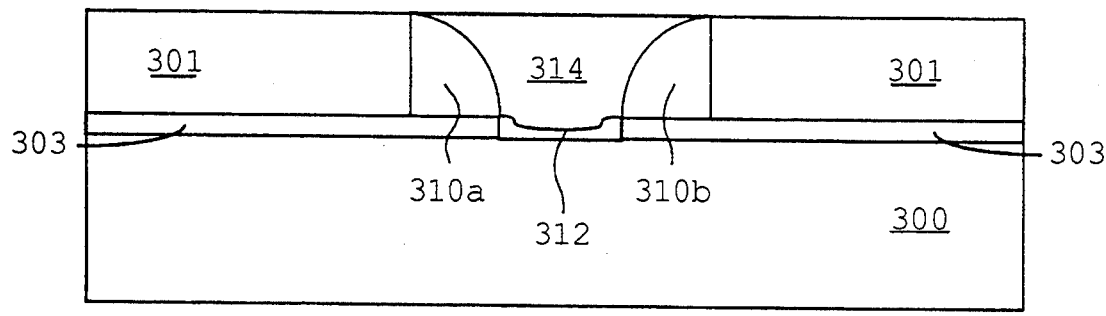
FIG. 3d is an illustration of a cross-sectional view of the semiconductor substrate of FIG. 3b after a layer has been deposited and etched back.

FIG. 3d illustrates the substrate region shown in FIG. 3c after subsequent processing in accordance with the present invention as discussed above in conjunction with FIGS. 2f and 2g. In particular, gate oxide 312 has been formed by thermal oxidation of the underlying silicon region. As discussed above, in alternate embodiments, gate oxide 312 may comprise other dielectric materials suitable for use as a gate dielectric. Also, as discussed above, it may be desirable to grow and etch a sacrificial oxide on the underlying silicon region before forming gate oxide 312 in order to clean the silicon surface. Note that the temperatures required for thermal oxidation to form gate oxide 312 have caused diffusion of implanted region 303 deeper into substrate 300. Again, as discussed above, polysilicon gate electrode 314 has been formed by deposition of polysilicon followed by chemical-mechanical polishing of the polysilicon layer back to the surface of layer 301.

Figure 3E:
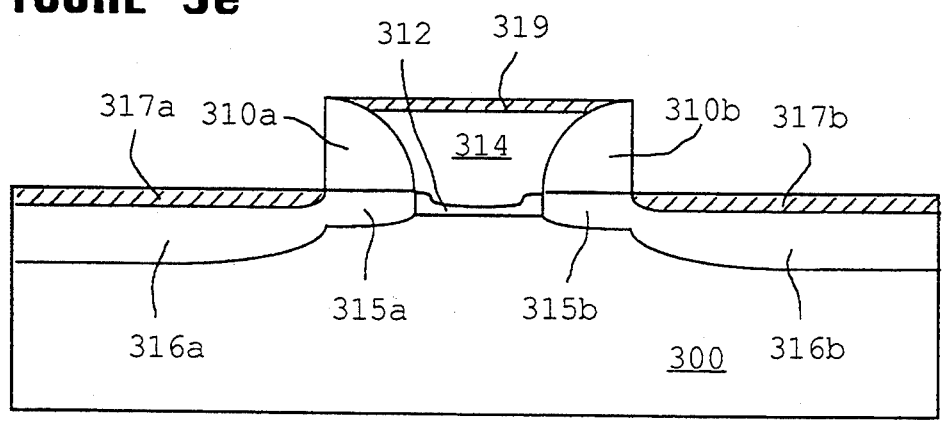
FIG. 3e is an illustration of a cross-sectional view of the semiconductor substrate of FIG. 3c after silicidation has been performed.

FIG. 3e displays the region of semiconductor substrate 300 shown in FIG. 3d after layer 301 has been removed, source/drain implants have been performed and silicidation has occurred as discussed above in conjunction with FIGS. 2h and 2i. Note, however, that in the present embodiment there is no need to perform an angled implant to form tip regions 315a and 315b. Tip regions 315a and 315b are merely the result of further diffusion of the implant region 303 into substrate 300. Source/drain regions 316a and 316b may be implanted, as discussed above, aligned to spacers 310a and 310b. Silicide regions 317a and 317b and polycide region 319 are formed substantially the same as discussed above in conjunction with FIG. 2i.

The embodiment of the present invention depicted in FIGS. 3a–3d have some significant advantages over the basic process flow described in conjunction with FIG. 2a–2i. For example, note that the tip regions 315a and 315b are raised or elevated with respect to gate oxide 312 as compared to the analogous structure depicted in FIG. 2i. The raising of tip regions 315a and 315b serves to reduce short channel effects and additionally helps hot electron reliability of the transistor. Furthermore, tip regions 315a and 315b can be formed much thicker than the tip regions 108a and 108b depicted in FIG. 4f without hindering performance of the transistor. Thicker tip regions aid in reducing the series resistance as seen by an electrical current flowing through the transistor. One way to increase the thickness of tip regions 315a and 315b is to simply increase the thickness of implant layer 303 within substrate 300. Note, however, that as the thickness of implanted region 303 increases, so must the depth of the etch into the semiconductor substrate between spacers 310a and 310b as discussed above with respect to FIG. 3b.

Figure 4A:
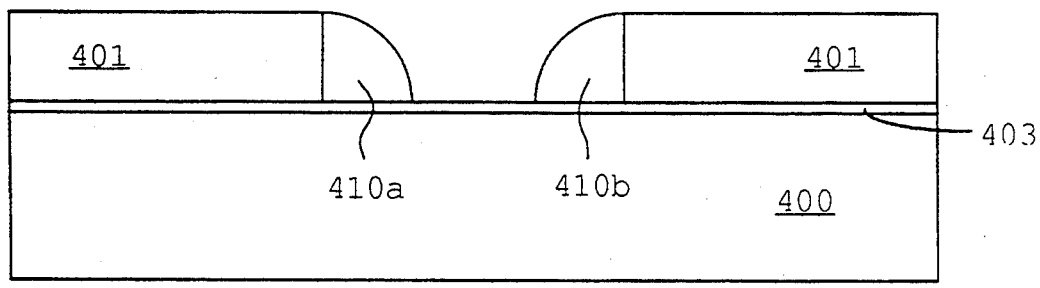
FIG. 4a is an illustration of a cross-sectional view of a semiconductor substrate after undergoing process steps in accordance with the present invention.

FIGS. 4a–4d illustrate an embodiment of the present invention in which the tip regions of the transistor are formed by a counterdoping process, and raised source/drain regions are formed by epitaxial growth. FIG. 4a illustrates a semiconductor substrate formed by a method in accordance with the present invention substantially as described above in conjunction with FIG. 2a–2e. The process illustrated by FIGS. 2a–2e has been performed on a substrate initially comprising dielectric layer 401 and implanted region 403 formed in semiconductor substrate 400. Spacers 410a and 410b are also formed substantially as described above.

Figure 4B:
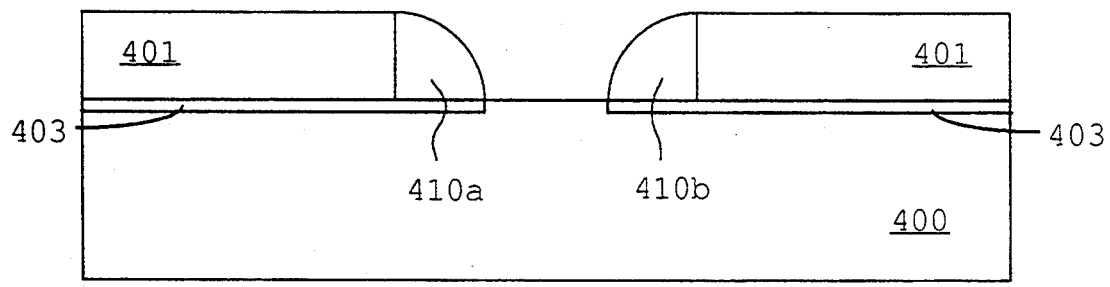
FIG. 4b is an illustration of a cross-sectional view of the semiconductor substrate of FIG. 4a after an implant has been performed.

FIG. 4b illustrates the substrate region shown in FIG. 4a after an implant has counterdoped the implanted layer 403 in the region between spacers 410a and 410b. Since implanted layer 403 is of a conductivity type opposite to that of substrate 400, a dopant having the same conductivity type as that used to dope semiconductor substrate 400 has been used to counterdope the implanted layer 403. The result is that the region between spacers 410a and 410b has been inverted back to the conductivity type of semiconductor substrate 400. The regions of implanted layer 403 which underlie spacers 410a and 410b will ultimately become tip regions of the final transistor.

Figure 4C:
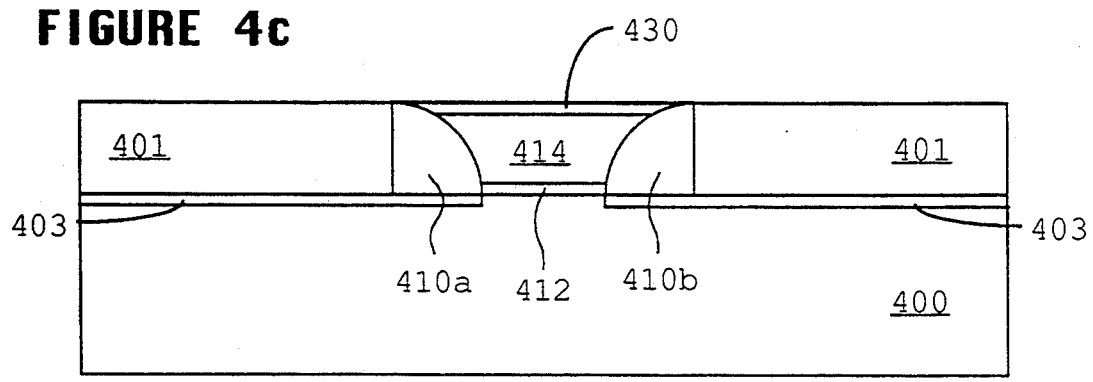
FIG. 4c is an illustration of a cross-sectional view of the semiconductor substrate of FIG. 4b after layers have been deposited within the trench.

FIG. 4c illustrates the substrate region shown in FIG. 4b after gate oxide 412 and polysilicon gate electrode 414 have been formed substantially as described above in conjunction with FIGS. 2f–2g. In an embodiment of the present invention in which raised source/drain regions are formed, the surface of polysilicon 414 is oxidized to form oxide layer 430. This oxide layer 430 will serve to protect the underlying polysilicon region 414 from the subsequent epitaxial growth of silicon described below. Alternatively, instead of forming the self-aligned oxide layer 430, an oxide or nitride layer is deposited across the surface of the substrate and patterned such that the oxide or nitride layer only remains on the surface of polysilicon region 414. Patterning of this oxide or nitride layer may be done by inverted resist patterning (negative to positive, and positive to negative) using the same mask used to pattern layer 401, or patterning may be done using an inverse mask field with respect to the mask used to pattern layer 401.

Figure 4D:
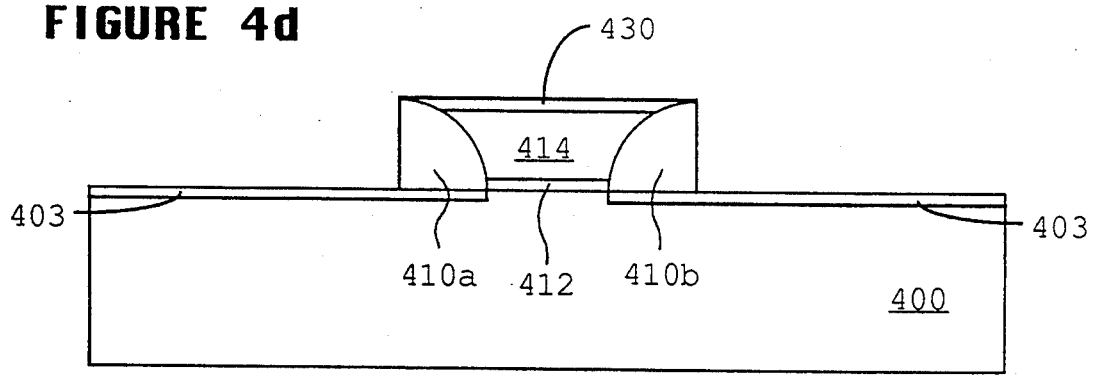
FIG. 4d is an illustration of a cross-sectional view of the semiconductor substrate of FIG. 4c after a layer has been removed.
Figure 4E:
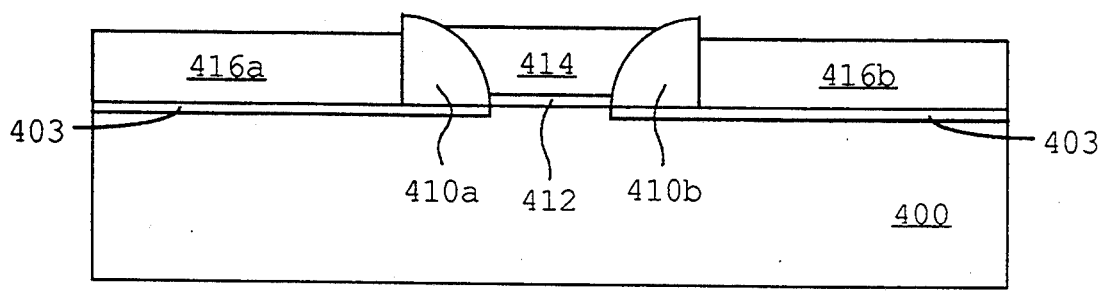
FIG. 4e is an illustration of a cross-sectional view of the semiconductor substrate of FIG. 4d after an epitaxial layer has been grown.

FIG. 4d illustrates the substrate region shown in FIG. 4c after layer 401 has been removed. The exposed silicon surface is used as a seed upon which epitaxial layers 416a and 416b are formed as shown in FIG. 4e. Epitaxial layers 416a and 416b are formed by deposition of silicon and are doped such that regions 416a and 416b become the source/drain regions of the transistor. Oxide layer 430 is subsequently removed and the transistor shown in FIG. 4e may be further processed to form, for example, silicide layers substantially as discussed above.

Figure 5A:
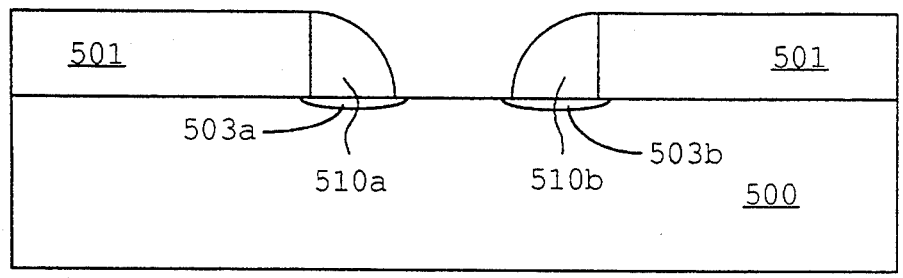
FIG. 5a is an illustration of a cross-sectional view of a semiconductor substrate in accordance with the present invention.

FIGS. 5a–5d illustrate an embodiment in which doped spacers are employed in conjunction with a raised tip process. FIG. 5a illustrates a portion of a semiconductor substrate formed in accordance with the present invention. The structure shown in FIG. 5a may be formed by a method substantially similar to that described above in conjunction with FIGS. 2a–2e. However, the material used to form spacers 510a and 510b has been doped by a species having a conductivity type which is opposite from the dopant used to dope semiconductor substrate 500. After a thermal process step, the dopant material within spacers 510a and 510b diffuses into semiconductor substrate 500 to form the doped regions 503a and 503b. As discussed above, layer 501 comprises a suitable dielectric material. Alternatively, spacers 510a and 510b are removed and replaced by permanent spacers once regions 503a and 503b have been formed.

Figure 5B:
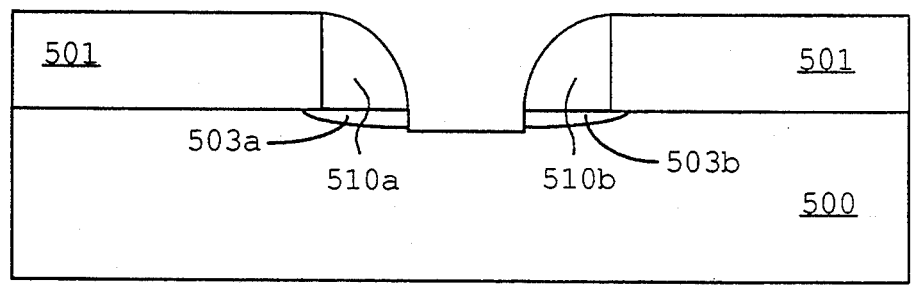
FIG. 5b is an illustration of a cross-sectional view of the semiconductor substrate of FIG. 5a after an etch has been performed.

FIG. 5b illustrates the region of semiconductor substrate 500 shown in FIG. 5a after substrate 500 has been etched using spacers 510a and 510b and layer 501 as a mask. In the embodiment of FIG. 5b, substrate 500 is etched between spacers 510a and 510b to a depth which is beyond the depth of the junction between doped regions 503a and 503b and semiconductor substrate 500.

Figure 5C:
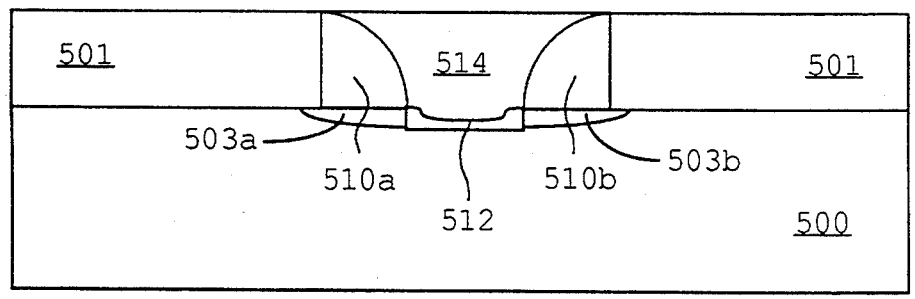
FIG. 5c is an illustration of a cross-sectional view of the semiconductor substrate of FIG. 5b after layers have been formed within the trench.

FIG. 5c illustrates the region depicted in FIG. 5b after a gate oxide 512 and polysilicon gate electrode 514 have been formed in accordance with the present invention as discussed above with conjunction with FIGS. 2f–2g.

Figure 5D:
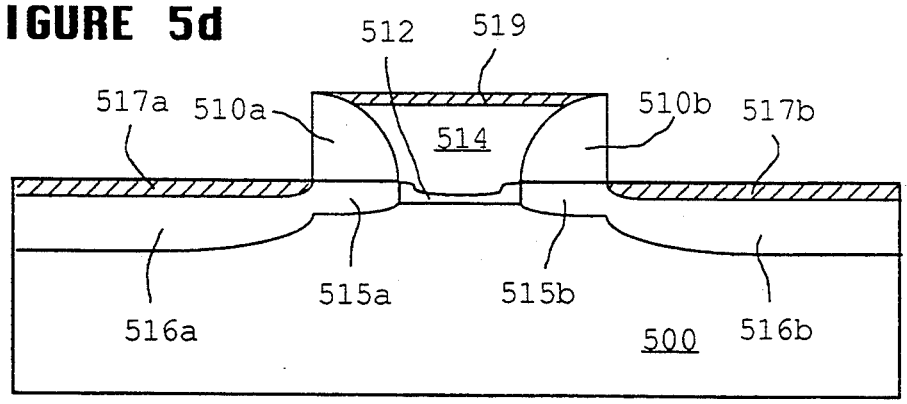
FIG. 5d is an illustration of a cross-sectional view of the semiconductor substrate of FIG. 5c after subsequent processing in accordance with the present invention.

FIG. 5d illustrates the substrate region shown in FIG. 5c after layer 501 has been removed, source/drain regions 516a and 516b have been formed, and silicide regions 517a and 517b and 519 have been formed in accordance with the present invention as described above in conjunction with FIGS. 2h–2i. Note, however, that in the present embodiment it has not been necessary to perform angled implants in order to form tip regions 515a and 515b. Instead, raised tip regions 515a and 515b are the result of diffusion from the doped spacers 510a and 510b.

Figure 6A:
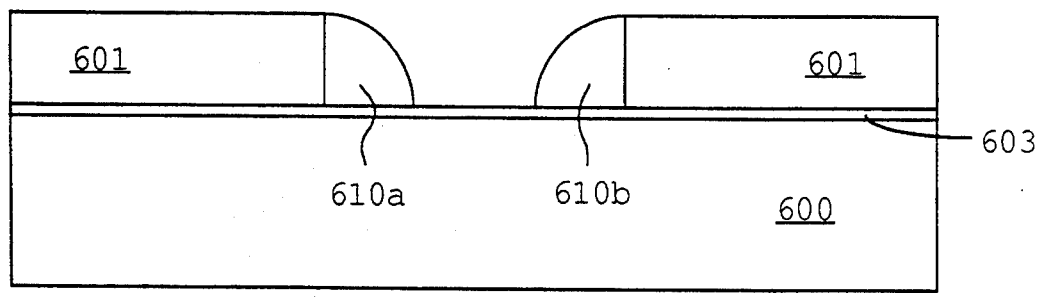
FIG. 6a is an illustration of a cross-sectional view of a semiconductor substrate in accordance with the present invention.
Figure 6B:
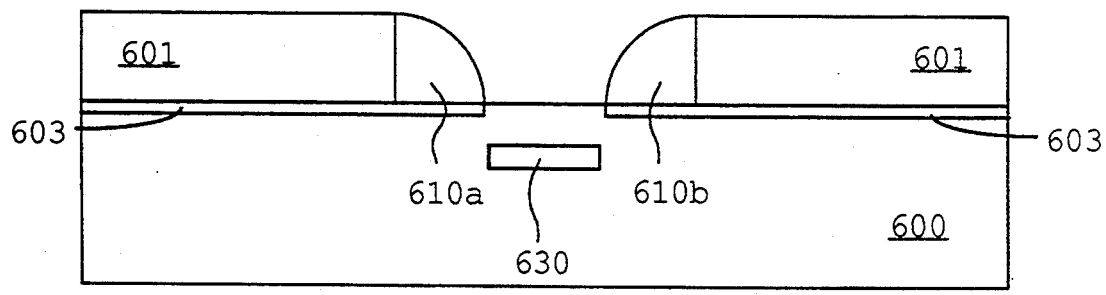
FIG. 6b is an illustration of a cross-sectional view of the semiconductor substrate of FIG. 6a after an implant has been performed.
Figure 6C:
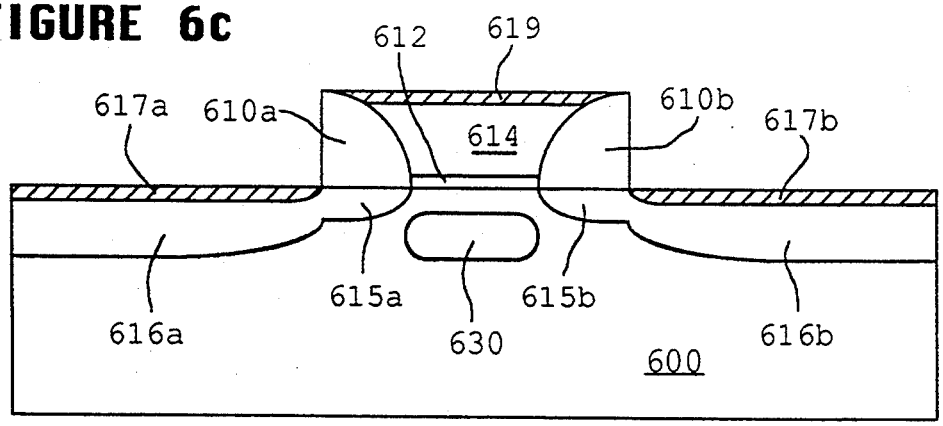
FIG. 6c is an illustration of a cross-sectional view of the semiconductor substrate of FIG. 6b after subsequent processing in accordance with the present invention.

FIGS. 6a–6c illustrate an embodiment of the present invention in which tip regions are formed by a counterdoping process and self-aligned channel punchthrough stoppers are implanted. Note that self-aligned channel punchthrough stoppers may be employed in conjunction with virtually any embodiment of the present invention. FIG. 6a illustrates a structure formed in accordance with the present invention as described above in conjunction with FIG. 2a–2e where an implanted layer 603 has initially been formed in substrate 600 beneath layer 601. Implanted layer 603 is of a conductivity type which is opposite to that of semiconductor substrate 600. Spacers 610a and 610b have also been formed substantially as described above.

FIG. 6b illustrates the region of the semiconductor substrate shown in FIG. 6a where implanted layer 603 has been counterdoped in the region between spacers 610a and 610b by shallow implantation of a dopant species which is opposite in conductivity type to the species used to form implant layer 603. In addition, punchthrough stopper 630 has been formed by implanting a dopant material of the same conductivity type as that which exists within semiconductor substrate 600. Note that this punchthrough stopper 630 is self-aligned within the transistor channel between spacers 610a and 610b.

Semiconductor processing in accordance with the present invention is used to form the structure shown in FIG. 6c where layer 601 has been removed, source/drain regions 616a and 616b have been formed, silicide layers 617a and 617b and 619 have been formed, gate oxide 612 and polysilicon gate electrode 614 have been formed, tip regions 615a and 615b have been formed from implanted layer 603, and punchthrough stopper 630 has diffused outward by thermal processing steps. Punchthrough stopper 630 serves to raise the source/drain punchthrough voltage of the transistor of FIG. 6c, and additionally serves to reduce the capacitance between the source and drain of this transistor.

FIGS. 3a–6c have served to illustrate variations of the basic method described in conjunction with FIGS. 2a–2i. It will be appreciated by one skilled in the art that the method illustrated by FIGS. 3a–6c maybe combined in a multitude of ways depending on the practitioner's particular requirements. Various combinations of, for example, raised tip processing, counterdoped tip implants, disposable spacer flows, diffusion from doped spacers, tipless flow processes, angled implantation, raised source/drains, and punchthrough stopper implants may be employed in conjunction with other teaching of the present invention. FIGS. 3a–6c have been presented in order to suggest potential combinations available to one practicing the method of the present invention.

Thus, a novel transistor manufacturing process has been described which serves to improve the packing density and performance of the overall IC by minimizing transistor dimensions while remaining compatible with conventional lithographic technologies.

What is claimed is:

1. A process for forming a transistor on a semiconductor substrate, said process comprising the steps of:
   a) forming a first layer over said semiconductor substrate;
   b) etching a trench in said first layer;
   c) forming two spacers over said semiconductor substrate within said trench, each of said spacers being adjacent to a laterally opposing wall within said trench;
   d) forming a gate dielectric over said semiconductor substrate between said spacers within said trench; and
   e) forming a gate electrode over said gate dielectric between said spacers within said trench by depositing a gate electrode material to fill said trench, then etching back said gate electrode material until substantially planar with said first layer;
   f) removing said first layer; and
   g) forming source/drain regions of said transistor, said source/drain regions being substantially aligned to said spacers.

2. The process of claim 1 further comprising the step of forming a self-aligned punchthrough stopper by implanting dopants into said semiconductor substrate substantially aligned to said spacers.

3. The process of claim 1 further comprising the step of forming a silicide layer at the surface of said source/drain regions of said transistor.

4. The process of claim 1 further comprising the step of forming tip regions in said semiconductor substrate beneath at least a portion of said spacers by a process comprising an angled implant.

5. The process of claim 1 further comprising the step of forming tip regions in said semiconductor substrate beneath at least a portion of said spacers by a process comprising diffusion from doped spacers.

6. The process of claim 1 further comprising the step of forming tip regions in said semiconductor substrate beneath at least a portion of said spacers by a process comprising forming a doped layer near the surface of said semiconductor substrate within said trench, and etching the doped layer from said semiconductor substrate between said spacers.

7. The process of claim 1 wherein said etching back of said gate electrode material is accomplished by a technique comprising chemical mechanical polishing.

8. The process of claim 1 wherein said gate electrode material comprises polysilicon.

9. The process of claim 8 wherein said gate electrode material comprises polysilicon.

10. The process of claim 1 wherein said first layer is selected from the group consisting essentially of nitride, oxide, BSG, PSG, and any combination thereof.

11. The process of claim 10 wherein said first layer is deposited to a thickness in the range of approximately 0.05–1.0 μm.

12. The process of claim 1 wherein said trench is etched to a width in the range of approximately 0.1–1.0 μm.

13. The process of claim 1 wherein said spacers are formed by a process including a substantially conformal deposition within said trench of a spacer material selected from the group consisting of nitride, oxide, BSG, PSG, and any combination thereof, and a subsequent, substantially anisotropic etch of said spacer material.

14. The process of claim 13 wherein said substantially conformal deposition of said spacer material is deposited to a thickness in the range of approximately 0.05–0.5 μm.

15. The process of claim 1 wherein said gate dielectric comprises oxide formed to a thickness in the range of approximately 10–100Å.

16. The process of claim 1 wherein said step of removing said first layer involves anisotropically etching said first layer in a self-aligned process using a dry etch chemistry having an etch selectivity of said first layer which is higher than its selectivity to said gate electrode material.

17. A process for forming a transistor on a semiconductor substrate, said process comprising the steps of:
   a) forming a first layer over said semiconductor substrate;
   b) etching a trench in said first layer;
   c) forming two spacers over said semiconductor substrate within said trench, said spacers being formed by a process including a substantially conformal deposition within said trench of a dielectric spacer material, and a subsequent, substantially anisotropic etch of said spacer material;
   d) forming a gate oxide over said semiconductor substrate between said spacers within said trench;
   e) forming a gate electrode over said gate oxide between said spacers within said trench by depositing polysilicon to fill said trench, then etching back said polysilicon until substantially planar with said first layer by using a chemical mechanical polishing technique; and
   f) removing said first layer and forming source/drain regions of said transistor, said source/drain regions being substantially aligned to said spacers.

18. The process of claim 17 further comprising the step of performing a salicidation of exposed silicon regions of said transistor.

19. The process of claim 18 further comprising the step of forming a self-aligned punchthrough stopper by implanting dopants into said semiconductor substrate substantially aligned to said spacers.

20. The process of claim 18 further comprising the step of forming tip regions in said semiconductor substrate beneath at least a portion of said spacers by a process comprising an angled implant.

21. The process of claim 18 further comprising the step of forming tip regions in said semiconductor substrate beneath at least a portion of said spacers by a process comprising diffusion from doped spacers.

22. The process of claim 18 further comprising the step of forming tip regions in said semiconductor substrate beneath at least a portion of said spacers by a process comprising forming a doped layer near the surface of said semiconductor substrate within said trench, and etching the doped layer from said semiconductor substrate between said spacers.

23. The process of claim 18 further comprising the step of forming tip regions in said semiconductor substrate beneath at least a portion of said spacers by a process comprising removing said spacers and implanting dopant material directly into at least a portion of the region of said semiconductor substrate from which said spacers were removed.

24. The process of claim 18 further comprising the step of forming tip regions in said semiconductor substrate beneath at least a portion of said spacers by a process comprising forming a doped layer near the surface of said semiconductor substrate within said trench, and counterdoping said doped layer between said spacers.

25. The process of claim 18 wherein said source/drain regions are formed by a method comprising selectively growing epitaxial source/drain regions to create a raised source/drain transistor.

* * * * *

UNITED STATES PATENT AND TRADEMARK OFFICE
CERTIFICATE OF CORRECTION

PATENT NO.   : 5,434,093
DATED        : July 18, 1995
INVENTOR(S)  : Chau et al.

It is certified that error appears in the above-identified patent and that said Letters Patent is hereby corrected as shown below:

In column 17 at line 8 delete "claim 10" and insert --claim 9--

In column 18 at line 10 delete "claim 18" and insert --claim 17--

In column 18 at line 14 delete "claim 18" and insert --claim 17--

In column 18 at line 18 delete "claim 18" and insert --claim 17--

In column 18 at line 22 delete "claim 18" and insert --claim 17--

In column 18 at line 29 delete "claim 18" and insert --claim 17--

In column 18 at line 37 delete "claim 18" and insert --claim 17--

In column 18 at line 44 delete "claim 18" and insert --claim 17--

Signed and Sealed this

Thirty-first Day of December, 1996

*Attest:*

BRUCE LEHMAN

*Attesting Officer*  *Commissioner of Patents and Trademarks*